US009958496B2

(12) United States Patent
Moran et al.

(10) Patent No.: US 9,958,496 B2
(45) Date of Patent: May 1, 2018

(54) LAYER-LAYER REGISTRATION COUPON FOR PRINTED CIRCUIT BOARDS

(71) Applicant: Oracle International Corporation, Redwood City, CA (US)

(72) Inventors: Stephanie Moran, San Francisco, CA (US); Michael C. Freda, Morgan Hill, CA (US); Karl Sauter, Pleasanton, CA (US)

(73) Assignee: Oracle International Corporation, Redwood Shores ( * ) Notice: Subject to any disclaimer, the term of this patent is extended or adjusted under 35 U.S.C. 154(b) by 277 days.

(21) Appl. No.: 14/838,605

(22) Filed: Aug. 28, 2015

(65) Prior Publication Data
US 2017/0059647 A1 Mar. 2, 2017

(51) Int. Cl.
*G01R 31/28* (2006.01)
*H05K 1/11* (2006.01)
(Continued)

(52) U.S. Cl.
CPC ....... *G01R 31/2813* (2013.01); *H05K 1/0266* (2013.01); *H05K 1/0268* (2013.01); *H05K 1/0298* (2013.01); *H05K 1/11* (2013.01); *H05K 3/0097* (2013.01); *H05K 3/4679* (2013.01); *H05K 1/167* (2013.01); *H05K 3/0052* (2013.01); *H05K 2201/097* (2013.01); *H05K 2201/09381* (2013.01); *H05K 2201/09636* (2013.01); *H05K 2201/09781* (2013.01); *H05K 2203/166* (2013.01)

(58) Field of Classification Search
CPC .... G01R 31/2813; H05K 1/11; H05K 1/0298; H05K 1/0266; H05K 3/0052

USPC .................................................. 324/763.01
See application file for complete search history.

(56) References Cited

U.S. PATENT DOCUMENTS 7,388,394 B1 6/2008 Primavera
7,619,434 B1 11/2009 Lorenz
(Continued)

FOREIGN PATENT DOCUMENTS

JP J0766517 12/1995

OTHER PUBLICATIONS

International Search Report and Written Opinion in application No. PCT/US2016/048338 dated Jan. 9, 2017.

*Primary Examiner* — Melissa Koval
*Assistant Examiner* — Courtney McDonnough
(74) *Attorney, Agent, or Firm* — Meyertons, Hood, Kivlin, Kowert & Goetzel, P.C.

(57) ABSTRACT

A method and apparatus for determining misregistration of internal layers of a PCB using resistance measurements is disclosed. In one embodiment, a method includes measuring a first resistance between a first center terminal and a first peripheral terminal of a first registration coupon on a printed circuit board (PCB) panel including at least one PCB. The method further includes measuring a second resistance between the first center terminal and a second peripheral terminal of the first registration coupon, wherein the first and second peripheral terminals are associated with a first internal layer of the PCB. A difference between the first and second resistances is then calculated. Then, based on this difference, a determination is made of a distance of misregistration of the first internal layer, if any, along a first axis.

17 Claims, 5 Drawing Sheets

(51) Int. Cl.
*H05K 1/02* (2006.01)
*H05K 3/46* (2006.01)
H05K 1/16 (2006.01)
H05K 3/00 (2006.01)

(56) References Cited

U.S. PATENT DOCUMENTS

| | | |
|---|---|---|
| 8,141,245 B2 | 3/2012 | Olson |
| 2008/0149382 A1* | 6/2008 | Karasawa .......... G01R 31/2805 174/262 |
| 2009/0065772 A1 | 3/2009 | Park |
| 2012/0318562 A1 | 12/2012 | Kim |

* cited by examiner

LAYER-LAYER REGISTRATION COUPON FOR PRINTED CIRCUIT BOARDS

BACKGROUND

1. Technical Field

This disclosure is directed to printed circuit boards (PCBs), and more particularly, to methodologies and structures for determining the registration between layers of a PCB.

2. Description of the Related Art

Modern PCBs typically include a number of different layers. A given PCB design may include at least one ground plane, at least one voltage plane, and at least one layer for conveying signals. Often times, PCBs will have multiple signal layers and in many cases, multiple instances of power and ground planes as well, particularly for those to be used in more complex systems.

In manufacturing PCB's having a number of layers, ensuring proper alignment between the layers (known as registration, or layer-layer registration) is an important factor to consider. During the various manufacturing processes, the layer-layer registration may become misaligned due to factors such as thermal expansion and contraction, among others. Accordingly, checking to ensure that the layer-layer registration is within a predetermined tolerance is important to ensure PCB quality. A wide variety of methods exists to determine layer-layer registration of PCBs.

SUMMARY OF THE DISCLOSURE

A method and apparatus for determining misregistration of internal layers of a PCB using resistance measurements is disclosed. In one embodiment, a method includes measuring a first resistance between a first center terminal and a first peripheral terminal of a first registration coupon on a printed circuit board (PCB) panel including at least one PCB. The method further includes measuring a second resistance between the first center terminal and a second peripheral terminal of the first registration coupon, wherein the first and second peripheral terminals are associated with a first internal layer of the PCB.

A difference between the first and second resistances is then determined. Based on this difference, a determination is made of a distance of misregistration of the first internal layer, if any, along a first axis.

In one embodiment, a printed circuit board (PCB) panel includes at least one PCB, wherein the PCB panel includes a plurality of internal layers. The PCB panel further includes a first registration coupon including a center terminal and a plurality of peripheral terminals surrounding the center terminal. The plurality of peripheral terminals are grouped into pairs, with each pair of peripheral terminals being electrically coupled to the center terminal on a corresponding one of the plurality of internal layers. The center terminal is accessible for performing resistance measurements between itself and any one of the plurality of peripheral terminals. The peripheral terminals include a first pair of terminals accessible for determining misregistration, if any, of a first one of the plurality of internal layers along a first axis. The peripheral terminals also include a second pair of terminals accessible for determining a misregistration, if any, of a second one of the plurality of internal layers along a second axis. It is noted that for one embodiments, no pad is provided for the center terminal on internal layers. Instead, the trace running through the center of the registration coupon is cut approximately in half by a drill. On the other hand, the peripheral terminals are implemented with large pads that are not themselves sensitive to misregistration.

BRIEF DESCRIPTION OF THE DRAWINGS

Other aspects of the disclosure will become apparent upon reading the following detailed description and upon reference to the accompanying drawings, which are now described as follows.

Figure 1:
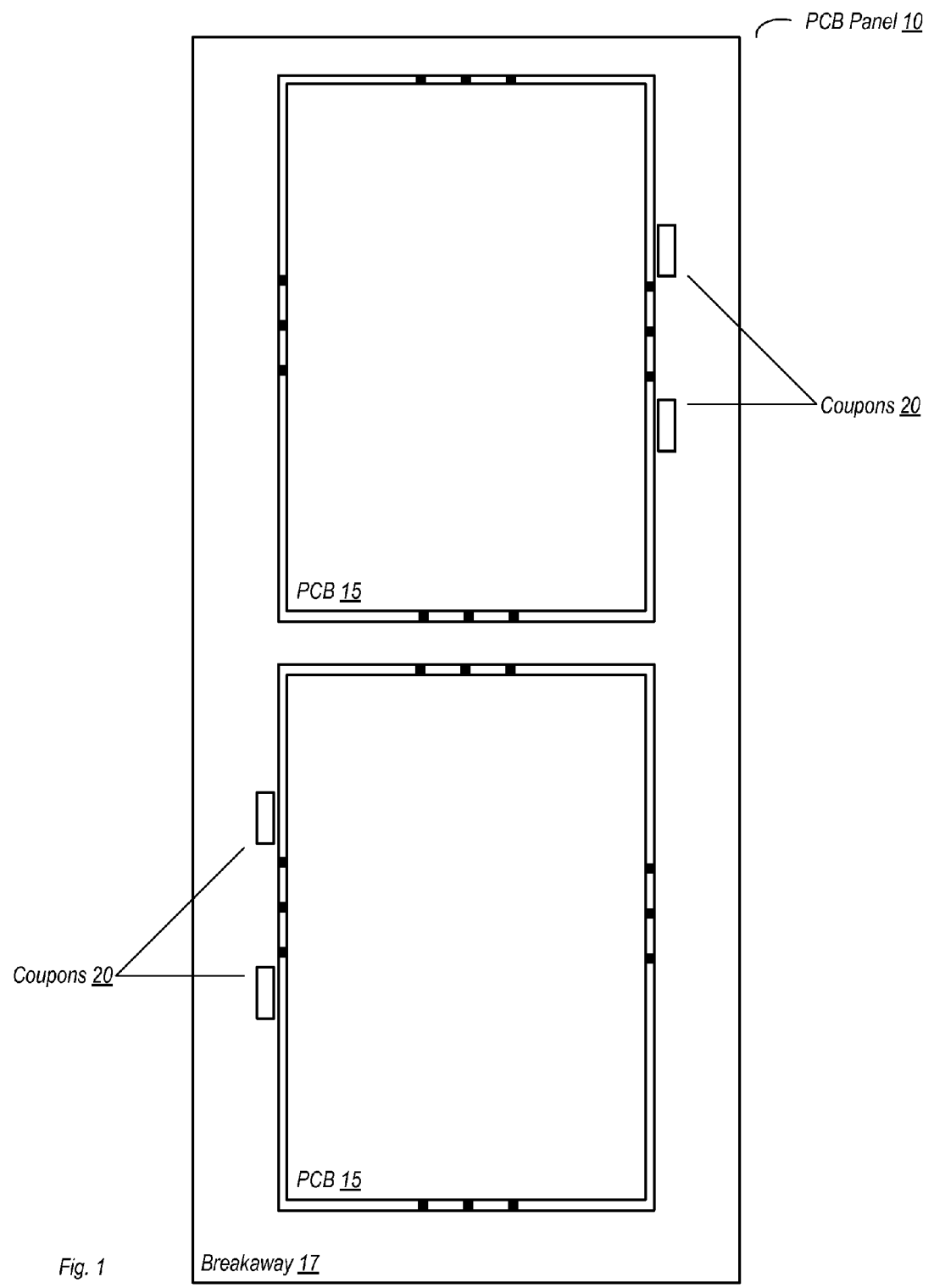
FIG. 1 is a drawing of one embodiment of a PCB panel having a number of PCBs and a number of registration coupons.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) (or pre-AIA paragraph six) interpretation for that unit/circuit/component.

DETAILED DESCRIPTION

Turning now to FIG. 1, a top view of a PCB panel with multiple PCBs is shown. In the illustrated example, PCB panel 10 includes two PCBs 15, although other embodiments may include a greater number of PCBs or as few as one. The drawing is representative of a final phase of manufacturing of the PCBs 15 before separation from breakaway 17. After separation, the PCBs 15 may have components mounted thereupon to form printed circuit assemblies (PCAs).

Each of the PCBs 15 in the embodiment shown has multiple conductive layers, which are separated from one another by dielectric layers. The conductive layers may include power planes (e.g., metal layers from which a supply voltage is distributed), ground/reference planes, and one or more signal layers in which signal traces are implemented to convey signals between components mounted on a subsequently assembled PCA. During manufacture, the entirety of the PCB panel 10 is manufactured with the various layers mentioned above, prior to an operation to form the outlines of the PCBs 15 themselves by cutting and/or drilling. Accordingly, each of the conductive layers and each of the dielectric layers of PCBs 15 are also present in breakaway 17.

During the various manufacturing processes, some of the internal conductive layers may become misaligned. The alignment of layers in a PCB is referred to as registration, and thus, misalignment may be referred to as misregistration. If the misregistration is severe enough, a PCB may become unusable. Furthermore, even when misregistration is not severe enough to render a PCB unusable, it may nevertheless be useful to determine the amount and direction of misregistration that is present. This may aid in the improvement of manufacturing processes and subsequently enable the manufacture of even more complex PCBs. To aid in determining the misregistration, if any, of internal conductive layers of a PCB 15, PCB panel 10 includes a number of coupons 20. In this example, the coupons are placed on breakaway 17 to preserve space on PCBs themselves for component footprints. However, it is possible and contemplated that such coupons 20 could be implemented on a PCB itself, in addition to or in lieu of the breakaway, as shown in this example.

As discussed further below, the coupons 20 shown on PCB panel 10 each comprise two separate coupons. A first coupon, a DC resistance coupons, is used to determine resistivity (in terms of resistance/unit distance) of conductive material on each of the various layers. A second coupon, a registration coupon, is used to determine misregistration for each of the various layers along a particular axis (e.g., along the x-axis or the y-axis). In this particular embodiment, there are two coupons 20 for each PCB 15. Using the two coupons 20 for each PCB, the misregistration along both an x-axis and a y-axis for each layer of a corresponding PCB 15 (e.g., the PCB 15 in closest proximity to the coupons 20).

Determining the misregistration along a particular axis for a given layer may be determined using resistance measurements. A first set of resistance measurements are made on the DC resistance coupon to determine the resistivity for the given layer. A second set of resistance measurements is used to determine the misregistration along a particular axis for a given layer. After the resistivity is determined, two separate resistance measurements may be made for the given layer using the registration coupon. A difference between the resistance measurements made using the registration coupon, combined with the previously determined resistivity may result in determining both the magnitude and direction of misregistration along a particular axis.

Figure 2:
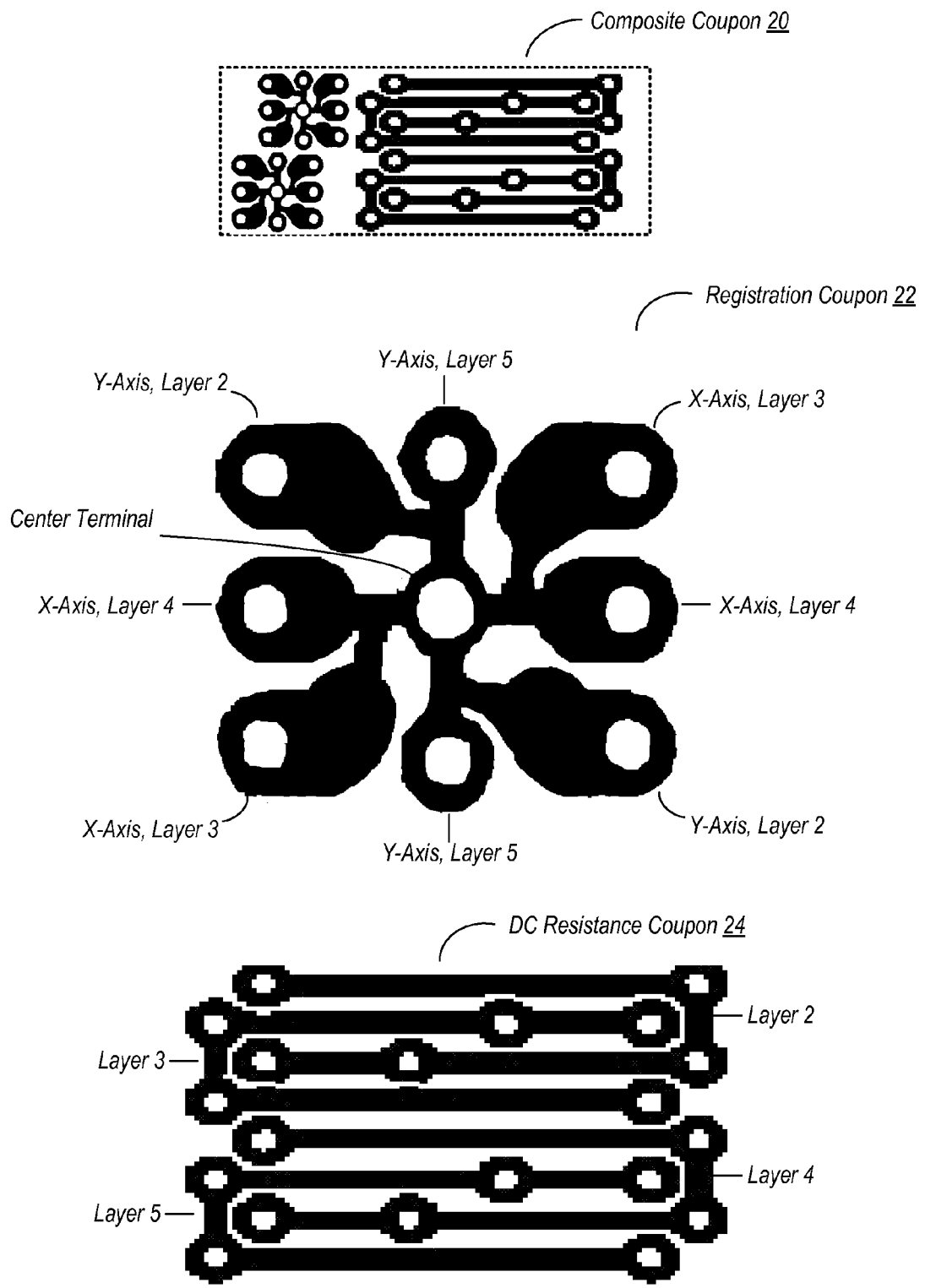
FIG. 2 is a drawing illustrating multiple top views of one embodiment of a registration coupon and an accompanying DC resistance coupon.

FIG. 2 is a drawing illustrating multiple top views of one embodiment of a registration coupon and an accompanying DC resistance coupon. More particularly, FIG. 2 further illustrates the composite coupon 20, along with the registration coupon 22 and DC resistance coupon 24 that form the composite coupon. It is to be noted that embodiments are possible and contemplated wherein the registration coupon(s) 22 and DC resistance coupon 24 are implemented separately from one another rather than on a composite coupon 20 as shown here. Furthermore, while composite coupon 20 as shown here includes two registration coupons 22, (to enable measurements along the X and Y axes for each layer associated therewith), the number of registration coupons 22 may be different in other embodiments. It is noted that the width of traces in registration coupon 22 and DC resistance coupon 24 may be substantially the same so as to closely match their respective resistivity values, and that the drawings here are not to scale.

One important aspect of composite coupon 20 as well as registration coupon 22 is their small size. For example, one embodiment of registration coupon 22 is no more than 0.15" on a side. This is significantly smaller than many other coupons implemented on PCBs/PCB panels for various reasons. Furthermore, composite coupon 20 in one embodiment is 0.3"×1.0". Due to the small size, finding locations on a PCB panel to place registration coupon 22 (and composite coupon 20 in some cases) may be made significantly easier.

Registration coupon 22 in the embodiment shown includes a center terminal and a number of peripheral terminals. Each of the peripheral terminals is associated with a particular layer and a particular axis. Moreover, the peripheral terminals are grouped into pairs. For example, the peripheral terminals in the upper left and lower right in the illustrated example are associated with the y-axis on layer 2 of the PCB panel in which registration coupon 22 is implemented. Similarly, the left middle and right middle peripheral terminals are associated with the x-axis on layer 4 of the PCB. The embodiment of registration coupon 22 shown here is configured for determining misregistration for two layers (layers 3 and 4) along the x-axis and two layers (layers 2 and 5) along the y-axis. It is noted that embodiments of a registration coupon configured to enable the determination of misregistration for a greater or less number of layers are possible and contemplated. As such, the number of peripheral terminals may also be different in such alternate embodiments.

The center terminal in the embodiment shown is electrically coupled to each of the peripheral terminals, and thus extends through each layer associated with registration coupon 22. The center terminal and each of the peripheral terminals are externally accessible from an outer portion of the board, through a corresponding via or plated through-hole (PTH). For a given layer, the conductive material of registration coupon 22 is implemented primarily on that layer, save for the via/PTH. For example, the conductive material associated with layer 2 in the exemplary registration coupon 22 of FIG. 2 is implemented primarily on layer 2, although a via/PTH allows for external electrical access to that layer.

DC resistance coupon 22 in the embodiment shown includes signal traces for determining the resistivity of four different layers, layer 2, 3, 4, and 5. A number of different terminals are present in each circuit trace, allowing for multiple resistance measurements to be taken. These resistance measurements may be used to determine the resistivity, or amount of resistance per unit distance for the corresponding layer. For example, the resistivity may be determined in ohms/mil, where 1 mil=0.001 inch.

Figure 3:
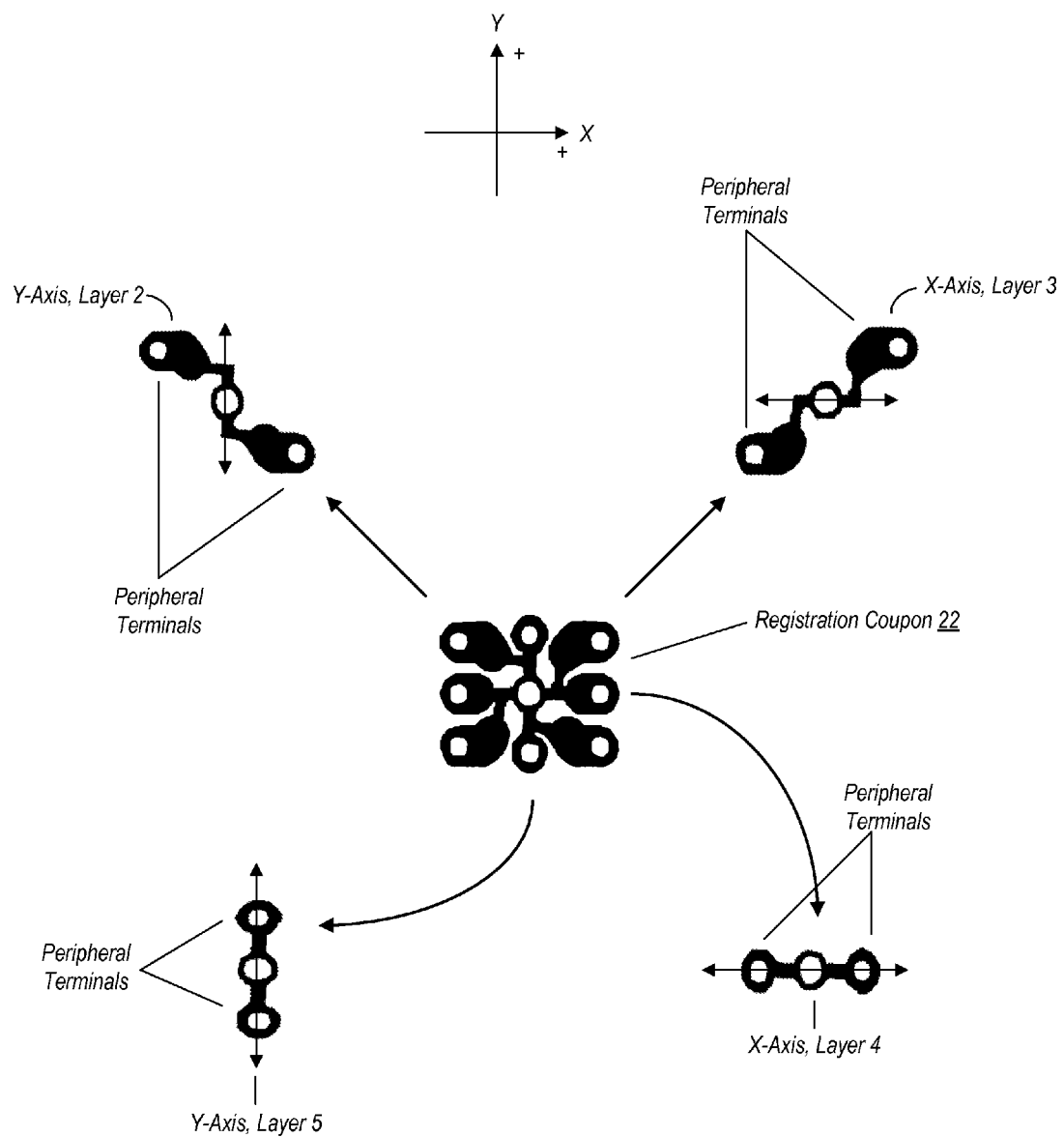
FIG. 3 is a drawing illustrating additional views of one embodiment of a registration coupon.

FIG. 3 is a drawing illustrating additional views of one embodiment of a registration coupon. More particularly, FIG. 3 further illustrates the embodiment of the registration coupon 22 introduced in FIG. 2. As noted above, registration coupon 22 in the embodiment discussed herein is configured to enable determining misregistration for four different layers, layers 2, 3, 4, and 5. For layers 2 and 5, misregistration may be determined along the y-axis, while misregistration along the x-axis may be determined for layers 3 and 4. On a typical PCB panel, a separate instances of registration coupon would be implemented to determine registration along the x-axis for layers 2 and 5 and along the y-axis for layers 3 and 4.

The axis along which misregistration is determined for a particular layer in a particular instance of registration coupon 22 is determined by the axis along which the path between peripheral terminals crosses the center terminal. For example, the instance of registration coupon 22 shown in FIG. 2 enables determination of misregistration along the y-axis for layer 2 due to the fact that the path between the peripheral terminals crosses the center terminal along the y-axis. Similarly, the path between the peripheral terminals for layer 3 crosses the center terminal along the x-axis, and thus this particular instance of registration coupon 22 may be used to determine misregistration for layer 3 along the x-axis.

Following a determining of resistivity for a particular layer, the misregistration for a given layer may be determined as follows. For a given layer, a first resistance measurement may be performed between the center terminal and a corresponding peripheral terminal of the registration coupon. A second resistance measurement is then performed between the center terminal and the other peripheral terminal for that layer. One of the resistance readings corresponds to movement in the positive direction along the axis of interest, while the other one of the resistance readings corresponds to movement in the negative direction along the axis of interest. For example, a resistance reading between the center terminal and the upper left terminal corresponds to movement along the y-axis in the positive direction for layer 2, as shown in FIG. 3. A resistance reading between the center terminal and the lower right terminal corresponds to movement along the y-axis in the negative direction for layer 2.

After taking the resistance readings, the difference there between is calculated and divided by two. If the result is positive, it indicates misregistration for that layer in the positive direction along the axis of interest. A negative result indicates misregistration for that layer in the negative direction along the axis of interest. The magnitude of the result indicates the amount of movement in the indicated direction along the axis of interest. A result of zero indicates that there is no misregistration for that layer along the axis of interest.

The process described above may be performed for every coupon on the PCB panel associated with a given PCB, and a determination may be made as to the misregistration, if any, for each layer along both the x- and y-axis. Since, for a given coupon as shown in FIGS. 2 and 3, the misregistration for a given layer is determined along one axis only, a counterpart registration coupon is provided which enables determination of the misregistration along the other axis.

Figure 4:
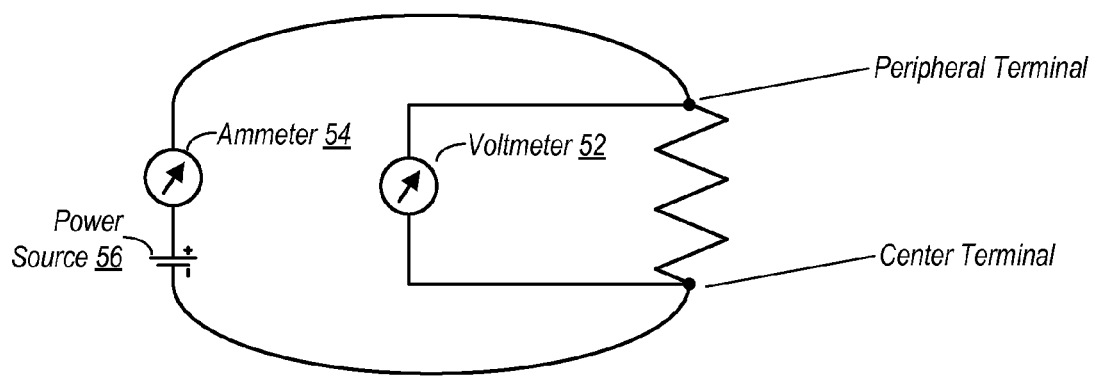
FIG. 4 schematically illustrates performing a 4-wire Kelvin resistance measurement on one embodiment of a registration coupon.

For more accuracy, the resistance measurements performed may be 4-wire Kelvin resistance measurements. This is schematically illustrated in FIG. 4. In the example shown, a voltmeter 52 is connected between the center terminal and one of the peripheral terminals. A series circuit including power source 56 and ammeter 54 is connected across the resistance between the center terminal and the peripheral terminal. The voltage drop across the resistance between the center terminal and peripheral terminal is measured by the voltmeter, while the current through the same path is measured by the ammeter. The voltage is then divided by the current to determine the resistance. Such readings may provide greater accuracy for measuring the resistance, and thus greater accuracy in determining the misregistration of the various layers.

Figure 5:
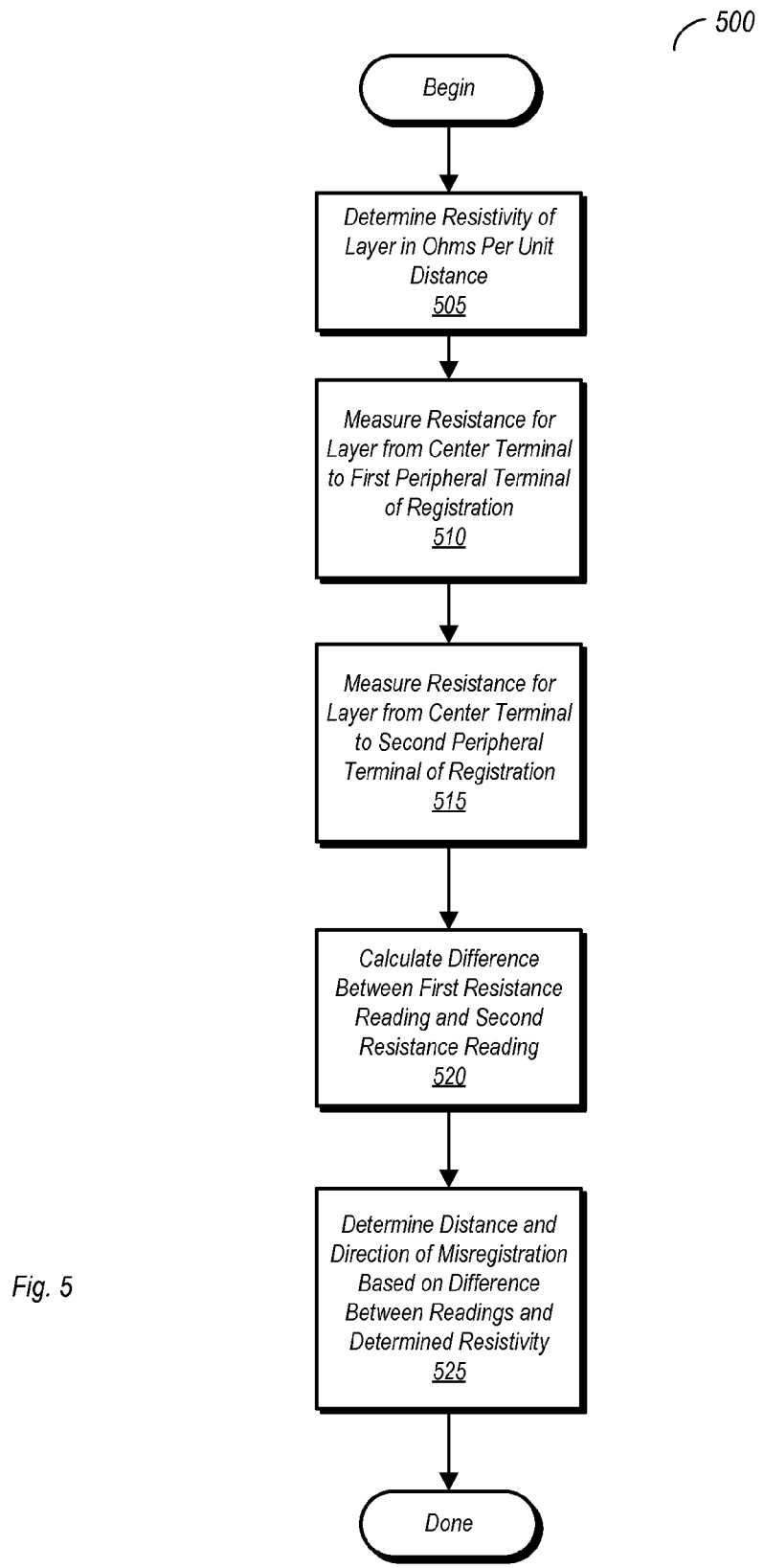
FIG. 5 is a flow diagram illustrating one embodiment of a method for determining misregistration of an internal layer of a PCB along two different axes.

Turning now to FIG. 5, a flow diagram illustrating one embodiment of a method for determining misregistration of an internal layer of a PCB is shown. Method 500 may be performed using various embodiments of the coupons discussed above, as well as with coupons not explicitly disclosed herein. Furthermore, it is noted that method 500 is directed toward determining the misregistration for one layer along one axis, but may be repeated as many times as desired to determine the misregistration for any number of layers along multiple axes.

Method 500 begins with the determination of the resistivity of a layer of interest, in ohms per unit distances (block 505). The determination may be made by performing one or more resistance measurements on a portion of a DC resistance coupon that corresponds to the layer of interest.

To determine the misregistration of the layer of interest, a first resistance measurement is made between a center terminal of the registration coupon and a first peripheral terminal corresponding to the layer of interest (block 510). Subsequently, a second resistance measurement is made between the center terminal and a second peripheral terminal corresponding to the layer of interest (block 515). One of the first and second resistance measurements corresponds to misregistration in a positive direction for along the axis of interest, while the other measurement correspond to misregistration in a negative direction along the axis of interest (e.g., x-axis or y-axis).

After taking the resistance readings on the registration coupon, the difference between the first and second resistances is determined (block 520), and the difference may also be divided by two. This result may be then converted into a distance using the resistivity determined from the resistance readings obtained from the DC resistance coupon. The end result yields the distance of misregistration for the layer of interest along the axis of interest, while the direction of misregistration is determined by the sign of the end result (block 525).

As previously noted, method 500 may be repeated as desired. For example, if the measurement described above determines the misregistration for a layer of interest along the x-axis, the method may be repeated using another registration coupon to determine the misregistration for the layer of interest along the y-axis.

Numerous variations and modifications will become apparent to those skilled in the art once the above disclosure is fully appreciated. It is intended that the following claims be interpreted to embrace all such variations and modifications.

What is claimed is:

1. Performing one or more resistance measurements on a resistance coupon on a PCB panel; determining a first conversion factor based on an amount of resistance per unit distance on the PCB panel determined during the one or more resistance measurements; measuring a first resistance between a first center terminal and a first peripheral terminal of a first registration coupon on a printed circuit board (PCB) panel including at least one PCB; measuring a second resistance between the first center terminal and a second peripheral terminal of the first registration coupon, wherein the first and second peripheral terminals are associated with a first internal layer of the PCB; determining a difference between the first and second resistances; and determining a distance of misregistration of the first internal layer, if any, along a first axis, based on the difference between the first and second resistances and the first conversion factor; measuring a third resistance between a second center terminal and a third peripheral terminal; measuring a fourth resistance between the second center terminal and a fourth peripheral terminal, the third and fourth peripheral terminals and the second center terminal being part of a second registration coupon on the PCB panel, and wherein the third and fourth peripheral terminals are associated with the first internal layer of the PCB; determining a difference between the third and fourth resistances; and determining a distance of misregistration of the first internal layer, if any, along a second axis, based on the difference between the third and fourth resistances.

2. The method as recited in claim 1, further comprising:
measuring a fifth resistance between the first center terminal and a fifth peripheral terminal of the first registration coupon;
measuring a sixth resistance between the first center terminal and a sixth peripheral terminal of the first registration coupon, wherein the fifth and sixth peripheral terminals are associated with a second internal layer of the PCB;
determining a difference between the fifth and sixth resistances; and
determining a distance of misregistration of the second internal layer, if any, along the first axis, based on the difference between the fifth and sixth resistances.

3. The method as recited in claim 2, further comprising:
measuring a seventh resistance between the second center terminal and a seventh peripheral terminal of the second registration coupon;
measuring an eighth resistance between the second center terminal and an eighth peripheral terminal of the second registration coupon, wherein the seventh and eighth peripheral terminals are associated with the second internal layer of the PCB;
determining a difference between the seventh and eighth resistances; and
determining a distance of misregistration of the second internal layer, if any, along the second axis, based on the difference between the seventh and eighth resistances.

4. The method as recited in claim 1, wherein the first axis and the second axis are perpendicular with respect to one another.

5. The method as recited in claim 1, wherein measuring the first and second resistances comprises performing 4-wire Kelvin resistance measurements.

6. The method as recited in claim 1, wherein the first registration coupon is located on a breakaway portion of the PCB panel, and wherein the method further comprises separating the breakaway portion from the PCB.

7. An apparatus comprising:
a printed circuit board (PCB) panel including at least one PCB, wherein the PCB panel includes a plurality of internal layers, wherein the PCB panel includes:
a DC resistance coupon, wherein the DC resistance coupon includes:
first and second terminals electrically coupled to one another by a first circuit trace on the first one of the plurality of internal layers, wherein the first and second terminals are accessible for performing resistance measurements on the first circuit trace; and
third and fourth terminals electrically coupled to one another by a second circuit trace on the second one of the plurality of internal layers, wherein the third and fourth terminals are accessible for performing resistance measurements on the second circuit trace; and
a first registration coupon including a center terminal and a plurality of peripheral terminals surrounding the center terminal, wherein the plurality of peripheral terminals are grouped into pairs, each pair of peripheral terminals is electrically coupled to the center terminal on a corresponding one of the plurality of internal layers, and wherein the center terminal is accessible for performing resistance measurements between itself and any one of the plurality of peripheral terminals;
wherein the plurality of peripheral terminals includes a first pair of terminals accessible for determining misregistration, if any, of a first one of the plurality of internal layers along a first axis, and further comprises a second pair of terminals accessible for determining a misregistration, if any, of a second one of the plurality of internal layers along a second axis.

8. The apparatus as recited in claim 7, wherein the first registration further comprises a third pair of terminals accessible for determining a misregistration, if any, of a third one of the plurality of internal layers along the first axis, and a fourth pair of terminals accessible for determining a misregistration, if any, of a fourth one of the plurality of internal layers along the second axis.

9. The apparatus as recited in claim 8, further comprising a second registration coupon, wherein the second registration coupon includes:
a fifth pair of terminals accessible for determining a misregistration, if any, of the first one of the plurality of internal layers along the second axis;
a sixth pair of terminals accessible for determining a misregistration, if any, of the second one of the plurality of internal layers along the first axis;
a seventh pair of terminals accessible for determining a misregistration, if any, of the third one of the plurality of internal layers along the second axis; and
an eighth pair of terminals accessible for determining a misregistration, if any, of the fourth one of the plurality of internal layers along the first axis.

10. The apparatus as recited in claim 7, wherein the first registration coupon is located on a breakaway portion of the PCB panel in proximity to the at least one PCB of the PCB panel.

11. The apparatus as recited in claim 7, wherein the first registration coupon has a maximum width of 0.15".

12. A method comprising:
determining an amount of resistance per unit of distance on each of a first internal layer and a second internal layer of a printed circuit board (PCB) panel including at least one PCB;
measuring first and second resistances on a first registration coupon, wherein the first resistance is measured between a center and first peripheral terminals of the first registration coupon, and wherein the second resistance is measured between the center terminal and a second peripheral terminal of the first registration coupon, wherein each of the first and second peripheral terminals are electrically connected to the center terminal on the first internal layer;
determining a difference between the first and second resistances; and determining a distance and direction of misregistration of the first internal layer, along a first axis, based on the difference between the first and second resistances and the amount of resistance per unit of distance of the first internal layer.

13. The method as recited in claim 12, further comprising:

measuring third and fourth resistances on the first registration coupon, wherein the third resistance is measured between the center terminal and a third peripheral terminal of the first registration coupon and wherein the fourth resistance is measured between the center terminal and a fourth peripheral terminal of the first registration coupon, wherein each of the third and further peripheral terminals are electrically connected to the center terminal on the second internal layer;

determining a difference between the third and fourth resistances; and determining a distance and direction of misregistration of the second internal layer, along a second axis that is perpendicular to the first axis, based on the difference between the third and fourth resistances and the amount of resistance per unit of distance of the second internal layer.

14. The method as recited in claim 13, further comprising:

measuring fifth and sixth resistances on a second registration coupon, wherein the fifth and sixth resistances are measured between a center terminal of the second registration coupon and fifth and sixth peripheral terminals, respectively, of the second registration coupon, wherein the fifth and sixth terminals are electrically connected to the center terminal of the second registration coupon on the first internal layer;

determining a difference between the fifth and sixth resistances; and determining a distance and direction of misregistration of the first internal layer, along the second axis, based on the difference between the fifth and sixth resistances and the amount of resistance per unit of distance of the first internal layer.

15. The method as recited in claim 14 measuring seventh and eighth resistances on the second registration coupon, wherein the seventh and eighth resistances are measured between the center terminal of the second registration coupon and seventh and eighth peripheral terminals, respectively, of the second registration coupon, wherein the seventh and eighth terminals are electrically connected to the center terminal of the second registration coupon on the second internal layer;

determining a difference between the seventh and eighth resistances; and determining a distance and direction of misregistration of the second internal layer, along the first axis, based on the difference between the seventh and eighth resistances and the amount of resistance per unit of distance of the second internal layer.

16. The method as recited in claim 12, wherein measuring the first and second resistances comprises performing 4-wire Kelvin resistance measurements.

17. The method as recited in claim 12, wherein the first registration coupon is located on a breakaway portion of the PCB panel, and wherein the method further comprises separating the breakaway portion from the at least one PCB subsequent to determining the misregistration, if any, for each internal layer of the PCB panel.

* * * * *